United States Patent
Nozawa et al.

(10) Patent No.: US 6,903,572 B2
(45) Date of Patent: Jun. 7, 2005

(54) SWITCH MATRIX CIRCUIT, LOGICAL OPERATION CIRCUIT, AND SWITCH CIRCUIT

(75) Inventors: Hiroshi Nozawa, Uji (JP); Shinzo Koyama, Kyoto (JP); Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/238,037

(22) Filed: Sep. 9, 2002

(65) Prior Publication Data

US 2003/0169071 A1 Sep. 11, 2003

(30) Foreign Application Priority Data

Mar. 5, 2002 (JP) ........................................ 2002-058379

(51) Int. Cl.⁷ ............................................ H03K 19/177
(52) U.S. Cl. .............................. 326/41; 326/38; 326/40
(58) Field of Search ................................ 326/37–41, 47

(56) References Cited

U.S. PATENT DOCUMENTS 5,898,317 A * 4/1999 Gardner et al. ................ 326/38
6,025,735 A * 2/2000 Gardner et al. ................ 326/38

* cited by examiner

*Primary Examiner*—Anh Q. Tran
(74) *Attorney, Agent, or Firm*—Hogan & Hartson LLP

(57) ABSTRACT

A switch circuit that is simple in constitution and capable of reliably controlling a switch cell is provided. Since the gate terminal G1 of a transistor M1 in a switch cell SC is connected only to the terminal 37 of a transistor M2, when the transistor M2 is set to off, the moving path of the charge accumulated at the gate G1 of the transistor M1 is shut off. Consequently, even if the transistor M2 is set to an on state and immediately set back to an off state, the transistor M1 remains for some period of time in an on or off state corresponding to the switching data given through a bit line BL. It is possible to cause the transistor M1 to remain in an on or off state for a specified period of time without disposing a specific circuit for temporary storing the switching data.

16 Claims, 10 Drawing Sheets

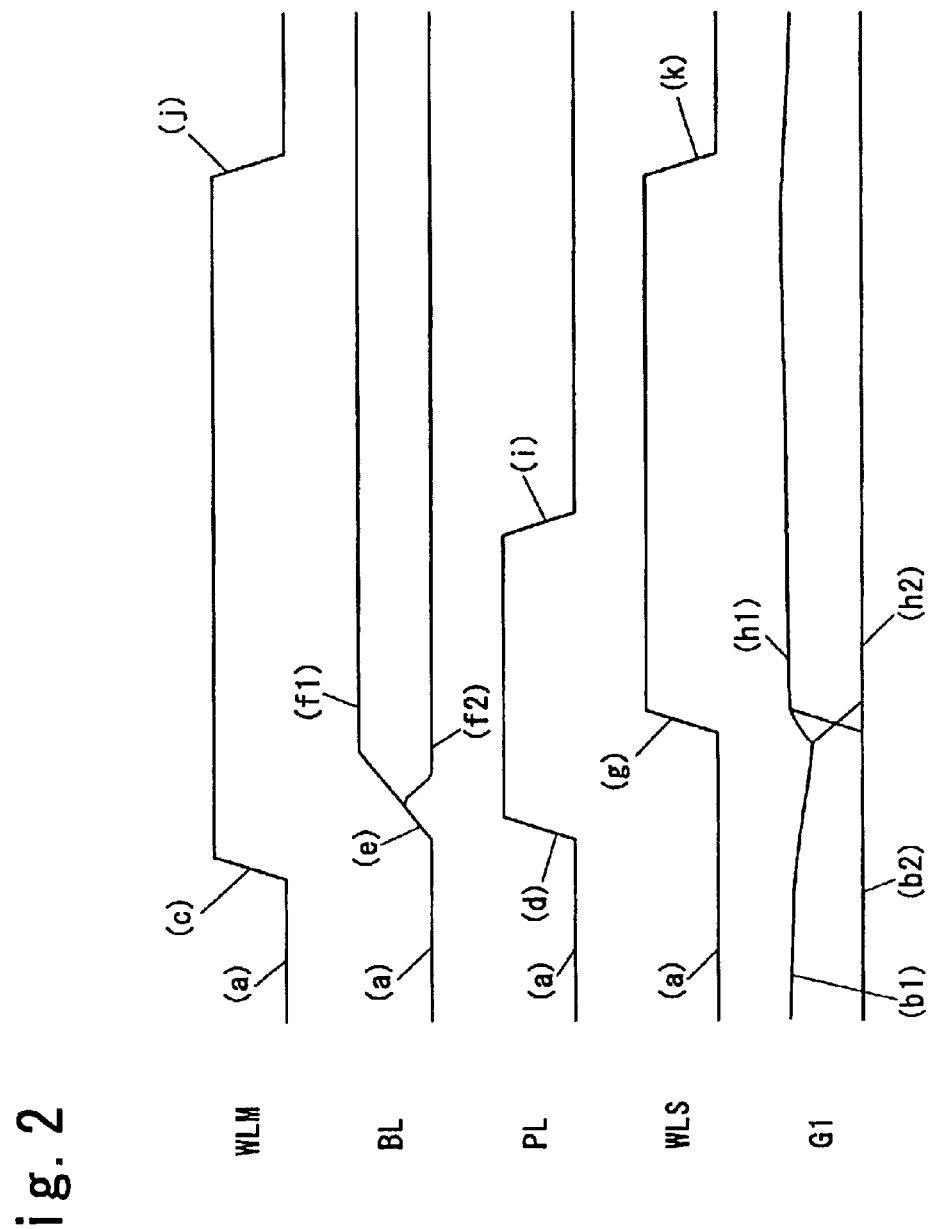

SWITCH MATRIX CIRCUIT, LOGICAL OPERATION CIRCUIT, AND SWITCH CIRCUIT

CROSS-REFERENCE TO RELATED APPLICATIONS

The entire disclosure of a Japanese Patent Application No. 2002-58379 filed on Mar. 5, 2002 including its specification, claims, drawings, and summary are incorporated herein by reference in its entirety.

BACKGROUND OF THE INVENTION

1. Field of the Invention

The present invention relates to a switch matrix circuit, a logical operation circuit, and a switch circuit.

2. Description of Prior Art

The FPGA (field programmable gate array) is known as a gate array that is programmable in the state of being implemented. FIGS. 10A and 10B show switch circuits used in the conventional FPGA.

The switch circuit 1 shown in FIG. 10A is provided with a transistor 5 and a cross-coupled flip-flop 3 connected to the gate terminal of the transistor 5. Gates (not shown) for constituting logic are connected to the input terminals 7 and 9 of the transistor 5.

The gates for constituting the logic may be connected to or disconnected from each other by turning on or off the transistor 5 according to the stored content (switching data) in the cross-coupled flip-flop 3. Since the data stored in the cross-coupled flip-flop 3 are rewritable, connection or disconnection between the logic constituting gates may be changed for any number of times.

The switch circuit 11 shown in FIG. 10B is provided with a floating gate type of transistor 13 instead of the cross-coupled flip-flop 3 shown in FIG. 10A.

The logic constituting gates may be connected to or disconnected from each other by turning on or off the transistor 5 according to the switching data stored in the floating gate type of transistor 13. Since the data stored in the floating gate type of transistor 13 are also rewritable, connection or disconnection between the logic constituting gates may be changed for any number of times.

Therefore, using an FPGA provided with a number of switch circuits 1 shown in FIG. 10A or switch circuits 11 shown in FIG. 10B, it is possible to change the logic constitution after implementation for any number of times.

However, the above-described switch circuit 1 or 11 in the conventional arrangement has the following problems.

That is to say, since the cross-coupled flip-flop 3 of the switch circuit 1 is a volatile memory element, the switching data are lost when power supply is turned off. Therefore, the switching data must be written to the cross-coupled flip-flop 3 every time the power supply is turned on. To avoid such a procedure, it is necessary to take such measures as keeping on a backup power after turning off the main power.

On the other hand, since the floating gate type of transistor 13 of the switch circuit 11 is a nonvolatile memory element, the cumbersome procedure or measures as required of the switch circuit 1 are unnecessary.

However, to rewrite the switching data of the floating gate type of transistor 13, an operation voltage higher than that for reading is required. This in turn requires a special (programming) device for rewriting the switching data.

Moreover, with the floating gate type of transistor 13, the writing speed is considerably slower than the reading speed. Furthermore, the rewritable number of times of the switching data to the floating gate type of transistor 13 is about $10^5$–$10^6$ times, and is not so much.

SUMMARY OF THE INVENTION

An object of the present invention is to provide a nonvolatile switch circuit, a switch matrix circuit, and a logical operation circuit, capable of solving the problems associated with the conventional switch circuits and capable of rewriting the switching data at high speeds without using a special programming device.

Another object of the present invention is to provide a switch circuit, a switch matrix circuit, and a logical operation circuit, capable of reliably controlling switch cells with simple constitution.

The switch matrix circuit according to the present invention is provided with a memory matrix section, a switch matrix section, one or more column choosing lines, plural memory row choosing lines, and plural switch row choosing lines. The memory matrix section is constituted with plural memory cells for storing switching data using memory elements, arranged in rows and columns. The switch matrix section is constituted with plural switch cells that take either conductive or nonconductive state, arranged in rows and columns corresponding to the memory cells. The one or more column choosing lines are provided corresponding to respective columns of the memory matrix section and the switch matrix section to choose the memory cells and the switch cells belonging to the same column of the memory matrix section and the switch matrix section. The plural memory row choosing lines are provided corresponding to respective rows of the memory matrix section for choosing the memory cells belonging to the same row of the memory matrix section. The plural switch row choosing lines are provided corresponding to respective rows of the switch matrix to choose switch cells belonging to the same row of the switch matrix.

The switch matrix circuit is arranged to choose an intended memory cell and a corresponding switch cell out of plural memory cells and switch cells using column choosing lines, memory row choosing lines, and switch row choosing lines, and at the same time to determine conductive or nonconductive state of the corresponding switch cell according to the switching data of the memory cell chosen. The switch cell is provided with a switch choosing element and a switch field effect transistor.

The switch choosing element is provided with a control terminal connected to the switch row choosing line, a first input-output terminal connected to the column choosing line, and a second input-output terminal to be conductive or nonconductive to the first input-output terminal according to an input signal inputted to the control terminal.

The switch field effect transistor is provided with a gate terminal connected to the second input-output terminal of the switch choosing element and first and second switch terminals to be mutually conductive or nonconductive according to the control signal inputted to the gate terminal.

The logical operation circuit according to the present invention is provided with a switch matrix circuit, an input data line, an output data line, a pair of power supply lines, and a plural number of logic constituting elements.

The logical operation circuit constitutes a logic using the switch matrix circuit, and applies logical operations to input data according to the constituted logic to obtain output data.

The switch matrix circuit is provided with a memory matrix section, a switch matrix section, one or more column choosing lines, plural memory row choosing lines, and plural switch row choosing lines.

The memory matrix section is constituted with plural memory cells, arranged in rows and columns, for storing switching data using memory elements. The switch matrix section is constituted with plural switch cells that take either conductive or nonconductive state, arranged in rows and columns corresponding to the memory cells.

The one or more column choosing lines are provided corresponding to respective columns of the memory matrix section and the switch matrix section to choose the memory cells and the switch cells belonging to the same column of the memory matrix section and the switch matrix section. The plural memory row choosing lines are provided corresponding to respective rows of the memory matrix section for choosing the memory cells belonging to the same row of the memory matrix section.

The plural switch row choosing lines are provided corresponding to respective rows of switch matrix section to choose switch cells belonging to the same row of the switch matrix section. The switch matrix circuit is arranged to choose an intended memory cell and a corresponding switch cell out of plural memory cells and plural switch cells using column choosing lines, memory row choosing lines, and switch row choosing lines, and at the same time to determine conductive or nonconductive state of the corresponding switch cell according to the switching data of the memory cell chosen.

The switch cell is provided with a switch choosing element and a switch field effect transistor. The switch choosing element is provided with a control terminal connected to the switch row choosing line, a first input-output terminal connected to the column choosing line, and a second input-output terminal to be conductive or nonconductive to the first input-output terminal according to an control signal inputted to the control terminal.

The switch field effect transistor is provided with a gate terminal connected to the second input-output terminal of the switch choosing element and first and second switch terminals to be mutually conductive or nonconductive according to a control signal inputted to the gate terminal.

The input data line is the one for inputting data, and the output data line is for outputting data.

The logic constituting element is provided with a control terminal, and first and second input-output terminals to be mutually conductive or nonconductive according to a control signal inputted to the control terminal.

The logical operation circuit is arranged to constitute logics by making mutually conductive or nonconductive the input data line, the output data line, the paired power supply line, the control terminals of the plural logic constituting elements, and the first and second input-output terminals of the plural logic constituting elements through the first and second switch terminals of the switch field effect transistor of the switch matrix circuit.

The switch circuit according to the present invention is provided with memory cells, switch cells, connection lines, and switch connection control lines.

The memory cells store switching data using memory elements.

The switch cell takes either conductive or nonconductive state.

The connection line interconnects the memory cell and the switch cell.

The switch connection control line carries switch connection control signals of whether or not to interconnect the memory cell and the switch cell through the connection line.

The switch circuit is arranged to determine the conductive or nonconductive state of the switch cell according to the switching data of the memory cell.

The switch cell is provided with a switch choosing element and a switch field effect transistor.

The switch choosing element is provided with a control terminal connected to the switch connection control line, a first input-output terminal connected to the connection line, and second input-output terminal to be conductive or nonconductive to the first input-output terminal according to the control signal inputted to the control terminal.

The switch field effect transistor is provided with a gate terminal connected to the second input-output terminal of the switch choosing element, and first and second switch terminals to be mutually conductive or nonconductive according to the control signal inputted to the gate terminal.

The switch circuit according to the present invention is provided with memory cells, switch cells, and connection lines. The memory cells store switching data using memory elements. The switch cell takes either conductive or nonconductive state. The connection line interconnects the memory cell and the switch cell.

The switch circuit is arranged to determine the conductive or nonconductive state of the switch cell according to the switching data of the memory cell.

The memory element is a ferroelectric capacitor having a first terminal connected to the connection line, and a second terminal.

The switch circuit is further provided with a plate line and a rated potential generating circuit.

The plate line is connected to the second terminal of the ferroelectric capacitor and used to apply a specified potential to the second terminal of the ferroelectric capacitor at the time of writing and reading operation of the switching data to and from the ferroelectric capacitor.

The rated potential generating circuit is connected to the connection line to generate the rated potential corresponding to the switching data at the time of reading operation of the switching data from the ferroelectric capacitor.

The switch cell is provided with switching elements.

The switching element has a control terminal connected to the connection line, and first and second switch terminals to be mutually conductive or nonconductive according to the control signal inputted to the control terminal.

While the features of the present invention may be broadly shown as described above, its constitution and contents together with its objects and features will become more apparent with the following disclosure in reference to appended drawings.

BRIEF DESCRIPTION OF THE DRAWINGS

FIG. 2 is a timing chart for explaining the switching action of the switch circuit 21.

DESCRIPTION OF PREFERRED EMBODIMENTS

Figure 1:
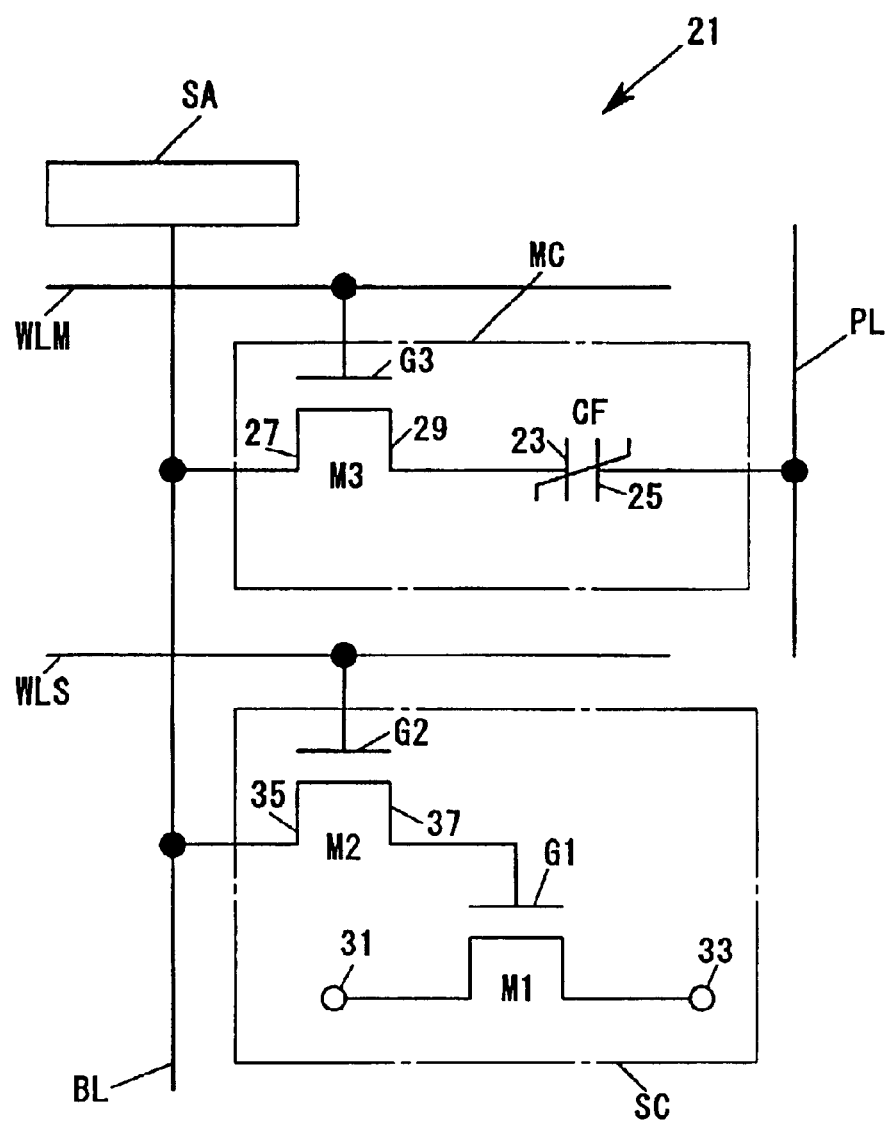
FIG. 1 is a circuit diagram showing a switch circuit 21 according to an embodiment of the present invention.

FIG. 1 is a circuit diagram showing a switch circuit 21 according to an embodiment of the present invention. The switch circuit 21 comprises: a memory cell MC, a switch cell SC, a connection line or a bit line BL, a memory connection control line or a memory word line WLM, a switch connection control line or a switch word line WLS, a plate line PL, and a rated potential generating circuit or a sense amplifier SA, arranged to determine the conductive or nonconductive state of the switch cell SC according to the switching data of the memory cell MC.

The memory cell MC is to store switching data using a memory element and comprises the memory element or a ferroelectric capacitor CF and a memory choosing element or a transistor M3.

The first terminal 23 of the ferroelectric capacitor CF is connected to the second input-output terminal 29 of the transistor M3. The second terminal 25 of the ferroelectric capacitor CF is connected to the plate line PL.

The plate line PL applies to the second terminal 25 of the ferroelectric capacitor CF, at the time of writing and reading actions of the switching data to and from the ferroelectric capacitor CF, a specified potential in a rectangular waveform in which an "H" potential (power supply potential VDD) and an "L" potential (ground potential GND) appear by turns.

The sense amplifier SA is connected to a bit line BL. The sense amplifier SA generates, at the time of reading action of the switching data from the ferroelectric capacitor CF, a specified potential, an "H" potential (power supply potential VDD) or an "L" potential (ground potential GND) corresponding to the switching data.

The transistor M3 comprises: a control terminal or a gate terminal G3 connected to the memory word line WLM, a first input-output terminal 27 connected to the bit line BL, and the above-mentioned terminal 29 to be conductive or nonconductive to the terminal 27 according to the control signal inputted to the gate terminal G3.

The switch cell SC is the one that takes either conductive or nonconductive state, comprising a switch choosing element or a transistor M2, and a switch field effect transistor M1.

The transistor M2 comprises a control terminal or a gate terminal G2 connected to the switching word line WLS, a first input-output terminal 35 connected to the bit line BL, and a second input-output terminal 37 to be conductive or nonconductive to the terminal 35 according to the control signal inputted to the gate terminal G2.

The transistor M1 comprises a gate terminal G1 connected to the terminal 37 of the transistor M2, and first and second terminals 31 and 33 to be mutually conductive or non conductive according to the control signal inputted to the gate terminal G1. Incidentally, the transistors M1, M2, and M3 in this embodiment are all n-channel, MOSFETs (metal oxide semiconductor field-effect transistors).

The bit line BL is a signal line interconnecting the memory cell MC and the switch cell SC. The memory word line WLM is a signal carrier line for carrying the memory connection control signal of whether or not to interconnect the memory cell MC and the bit line BL. The switching word line WLS is a signal carrier line for carrying the switch connection control signal of whether or not to interconnected the switch cell SC and the bit line BL.

Next, the function of the switch circuit 21 is described in reference to FIGS. 1 and 2. FIG. 2 is a timing chart for explaining the switching action of the switch circuit 21.

In the early period of the switching action, the memory word line WLM, the bit line BL, the plate line PL, and the switch word line WLS are all at the potential of "L" level (ground potential GND) indicated with (a) in FIG. 2. The sense amplifier SA is set to off.

Therefore, both of the transistors M2 and M3 are set to off, and the bit line BL is pre-charged at the ground potential GND. Since the transistor M2 is off, the gate terminal G1 of the transistor M1 maintains nearly the given potential (of "H" or "L" level) by the immediately previous action as indicated with (b1) and (b2) in FIG. 2.

Next, the potential "H" is given to the memory word line WLM as indicated with (c) in FIG. 2 to turn on the transistor M3, and also the potential "H" is given to the plate line PL as indicated with (d) in FIG. 2. When the "H" is given to the plate line PL, the potential of the bit line BL becomes an intermediate potential between "H" and "L" corresponding to the memory content (or the residual polarized state) of the ferroelectric capacitor CF as indicated with (e) in FIG. 2.

Here, the sense amplifier SA is turned on. This causes the potential of the bit line BL to be the rated potential ("H" or "L") corresponding to the above-mentioned intermediate potential as indicated with (f1) and (f2) in FIG. 2. In other words, the action up to here causes the potential of the bit line BL to be the rated potential corresponding to the memory content in the ferroelectric capacitor CF.

Next, the potential "H" is given to the switch word line WLS to turn on the transistor M2, as indicated with (g) in FIG. 2. This causes the potential at the gate terminal G1 of the transistor M1 to be equal to the potential of the bit line BL as indicated with (h1) and (h2) in FIG. 2.

When the potential of the gate terminal G1 becomes "H," the transistor M1 is turned on, and when the potential of the gate terminal G1 becomes "L," the transistor M1 is turned off. That is, the transistor M1 is turned on or off corresponding to the content stored in the ferroelectric capacitor CF.

Next, the plate line PL is made to "L" as indicated with (i) in FIG. 2. And the memory word line WLM and the switch word line WLS are brought to "L" to turn off the transistors M3 and M2, as indicated with (j) and (k) in FIG. 2.

Turning off the transistor M2 causes the gate terminal G1 of the transistor M1 to be separated from the bit line BL. At this time, if the potential of the gate terminal G1 is "L," the potential is kept unchanged. Therefore, the transistor M1 is also kept in the off state.

On the other hand, in the case the potential of the gate terminal G1 is "H," the electric charge accumulated at the gate terminal G1 gradually decreases through parasitic resistance of the transistor M1 and parasitic resistance of wiring lines. As a result, the potential of the gate terminal G1 also decreases gradually. When the potential of the gate terminal G1 decreases below the threshold potential of the transistor M1, the transistor M1 is turned off.

However, it is possible to maintain the on state of the transistor M1 until the next switching action by setting the time duration from separating the gate terminal G1 off the bit line BL (indicated with (k) in FIG. 2) to the next switching action of connecting the gate terminal G1 to the bit line BL (indicated with (g) in FIG. 2) smaller than the time constant of the circuit constituted with the gate capacity of the transistor M1 and the parasitic resistance.

Figure 3A:
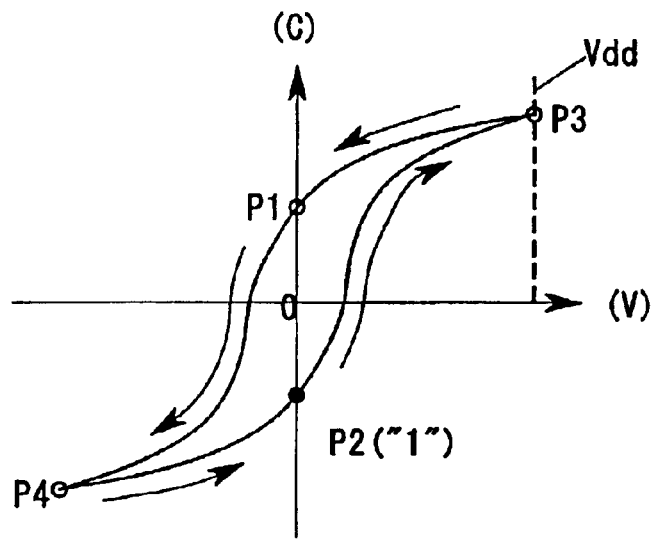
FIGS. 3A and 3B are diagrams for explaining the polarized state of the ferroelectric capacitor CF at the time of switching action of the switch circuit 21.
Figure 3B:
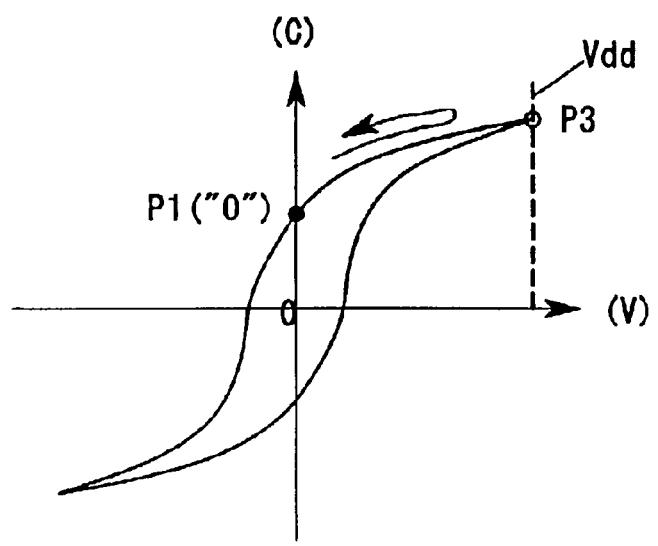

FIGS. 3A and 3B are for explaining the polarized state of the ferroelectric capacitor CF at the time of switching action of the switch circuit 21. As shown in FIG. 3B, in the case the content stored in the ferroelectric capacitor CF is "0" (corresponding to the polarized state P1 shown in FIG. 3B), the polarized state during the switching action changes from the polarized state P1 through P3 and back to P1. In other words, the polarized sense of the ferroelectric capacitor CF does not reverse during the switching action.

On the other hand, when the stored content of the ferroelectric capacitor CF is "1" as shown in FIG. 3A (corresponding to the polarized state P2), the polarized state of the capacitor during the switching action changes from P2 through P3, P1, and P4 and back to P2. That is to say, the polarized sense of the ferroelectric capacitor CF reverses once as indicated with P3 and P1 in FIG. 3A and then returns to the original state as indicated with P4 and P2 in FIG. 3A.

Using the ferroelectric capacitor CF, the plate line PL, and the sense amplifier SA as described above makes it possible to realize a nonvolatile memory cell of the so-called destructive read type with high data re-productiveness and a simple constitution. Therefore, it is possible to realize a switch circuit that is simple in constitution and high in reliability.

In this embodiment, since the gate terminal G1 of the transistor M1 is connected only to the terminal 37 of the transistor M2, the transfer path of the charge accumulated at the gate terminal G1 of the transistor M1 is shut off when the transistor M2 is set to an off state (nonconductive state).

Therefore, even after the transistor M2 is set to an off state, the transistor M1 maintains the previous state when the transistor M2 was on (conductive) for a period until the charge accumulated at the gate terminal G1 of the transistor M1 decreases to some extent.

Therefore, even if the transistor M2 is turned on and then immediately turned off, the transistor M1 maintains for a certain period of time the on or off state corresponding to the switching data given through the bit line BL. That is to say, using the transistor M2 of the simple constitution makes it possible to maintain the transistor M1 for a specified period of time in the on or off state corresponding to the switching data without employing a special circuit for temporarily storing the switching data.

Therefore, after the switching data are read and the conductive or nonconductive state of the switch cell SC is determined, for example even if the bit line BL is used for other purpose, the switch cell SC maintains the state corresponding to the switching data for the specified period of time. That is to say, it is possible to realize a switch circuit of a simple constitution, highly general nature, and capable of reliably controlling the switch cell SC.

Figure 4:
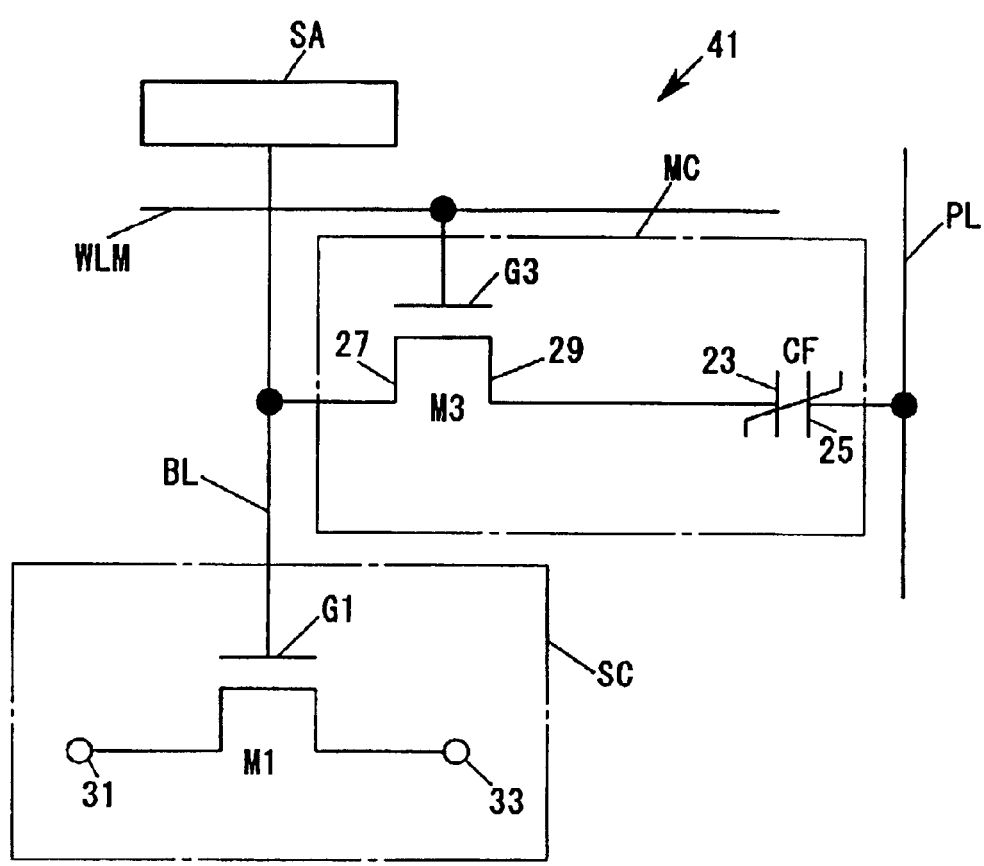
FIG. 4 shows a switch circuit 41 as another embodiment of the present invention.

Next, FIG. 4 shows a switch circuit 41 as another embodiment of the present invention. The switch circuit 41 resembles the switch circuit 21 shown in FIG. 1 but is partially different.

That is to say, the switch circuit 41 comprises the memory cell MC, the switch cell SC, the connection line or the bit line BL, the memory connection control line or the memory word line WLM, the plate line PL, and the rated potential generating circuit or the sense amplifier SA, and is arranged to determine the conductive or non conductive state of the switch cell SC according to the switching data of the memory cell MC.

The memory cell MC is a circuit for storing the switching data using a memory element, and comprises the memory element or the ferroelectric capacitor CF, and the memory choosing element or the transistor M3.

The first terminal 23 of the ferroelectric capacitor CF is connected to the second input-output terminal 29 of the transistor M3. The second terminal 25 of the ferroelectric capacitor CF is connected to the plate line PL.

The plate line PL applies to the second terminal 25 of the ferroelectric capacitor CF, at the time of writing and reading actions of the switching data to and from the ferroelectric capacitor CF, a specified potential in a rectangular waveform in which the potentials "H" and "L" appear by turns.

The sense amplifier SA is connected to the bit line BL. The sense amplifier SA generates the specified potential, the potential "H" or "L," corresponding to the switching data at the time of reading action of the switching data from the ferroelectric capacitor CF.

The transistor M3 comprises the control terminal or the gate terminal G3 connected to the memory word line WLM, the first input-output terminal 27 connected to the bit line BL, and the above-mentioned terminal 29 to be conductive or non conductive to the terminal 27 according to the control signal inputted to the gate terminal G3.

The switch cell SC is a circuit that takes either a conductive or nonconductive state and comprises a switching element or the transistor M1.

The transistor M1 comprises the control terminal or the gate terminal G1 connected to the bit line BL, and the first and second switch terminals 31 and 33 that become mutually either conductive or nonconductive according to the control signal inputted to the gate terminal G1. Incidentally, the transistors M1 and M3 used in this embodiment are both n-channel MOSFETs.

The bit line BL is a signal line for interconnecting the memory cell MC and the switch cell SC. The memory word line WLM is a signal line for carrying the memory connection control signals of whether or not to interconnect the memory cell MC and the bit line BL.

That is to say, the switch circuit 41 of this embodiment is constituted by removing the transistor M2 and the switching word line WLS from the switch circuit 21 shown in FIG. 1 and connecting the gate terminal G1 of the transistor M1 directly to the bit line BL.

With the above constitution, the switch circuit is further simplified. Using the ferroelectric capacitor CF, the plate line PL, and the sense amplifier SA as described above makes it possible to realize a nonvolatile memory cell of the so-called destructive read type with high data re-productiveness and a simple constitution. Therefore, it is possible to realize a switch circuit that is simple in constitution and high in reliability.

With the switch circuit 41 of this embodiment, however, the transistor M1, unlike the switch circuit 21 shown in FIG. 1, cannot be caused to maintain the on or off state corresponding to the switching data irrespective of the change in the potential of the bit line BL. Therefore, in the case switching data need to be temporarily stored in the switch cell SC, a separate circuit for storage must be provided.

Figure 5:
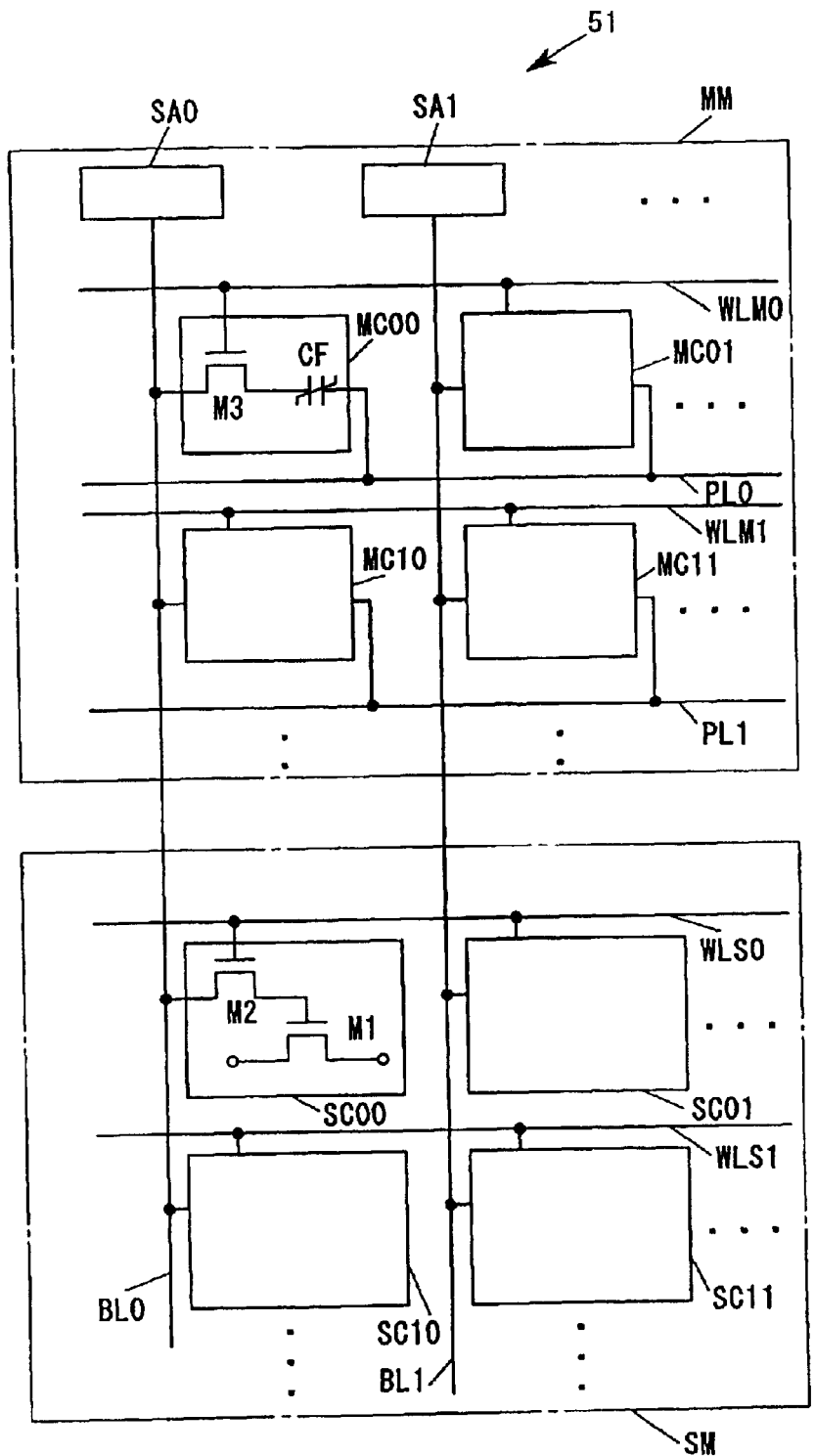
FIG. 5 shows a switch matrix circuit 51 as still another embodiment of the present invention.

Next, FIG. 5 is an equivalent circuit diagram showing a switch matrix circuit 51 as still another embodiment of the present invention. The switch matrix circuit 51 comprises a memory matrix section MM, a switch matrix section SM, column choosing lines or bit lines BL0, BL1, . . . , memory row choosing lines or memory word lines WLM0, WLM1, . . . , switch row choosing lines or switching word lines WLS0, WLS1, . . . , row choosing plate lines or plate lines PL0, PL1, . . . , and rated potential generating circuits or sense amplifiers SA0, SA1, . . . .

The memory matrix section MM comprises memory cells MC00, MC01, . . . , arranged in rows and columns for storing switching data using memory elements. The switch matrix section SM comprises switch cells SC00, SC01, . . . , that take either conductive or nonconductive state, and are arranged in rows and columns corresponding to the memory cells MC00, MC01, . . . .

The bit lines BL0, BL1, . . . , are provided corresponding to respective columns of the memory matrix section MM and the switch matrix section SM so as to choose the memory cells and switch cells that belong to the same column of the memory matrix section MM and the switch matrix section SM.

The memory word lines WLM0, WLM1, . . . , are provided corresponding to respective rows of the memory matrix section MM to choose the memory cells that belong to the same row of the memory matrix section MM. The switch word lines WLS0, WLS1, . . . , are provided to correspond to respective rows of the switch matrix section SM so as to choose the switch cells that belong to the same row of the switch matrix section SM.

The memory cells MC00, MC01, . . . , are constituted the same as the memory cell MC of the switch circuit 21 shown in FIG. 1. Namely, each of the memory cells MC00, MC01, . . . , comprises a transistor M3 and a ferroelectric capacitor CF.

The switch cells SC00, SC01, . . . , are also constituted the same as the switch cell SC of the switch circuit 21 shown in FIG. 1. Namely, each of the switch cells SC00, SC01, . . . , comprises transistors M1 and M2.

The plate lines PL0, PL1, . . . , are provided corresponding to respective rows of the memory matrix section MM so as to be connected only to the respective terminals 25 (See FIG. 1) of the ferroelectric capacitors CF constituting the memory cells belonging to the same row of the memory matrix section MM.

The sense amplifiers SA0, SA1, . . . , are connected respectively to the bit lines BL0, BL1, . . . , to generate a rated potential corresponding to the switching data at the time of reading the switching data from the ferroelectric capacitor CF. The sense amplifiers SA0, SA1, . . . , are constituted the same as the sense amplifier SA of the switch circuit 21 shown in FIG. 1.

The switch matrix circuit 51 is constituted to use the bit lines BL0, BL1, . . . , the memory word lines WLM0, WLM1, . . . , and the switch word lines WLS0, WLS1, . . . , to choose an intended memory cell and corresponding switch cell from among the memory cells MC00, MC01, . . . , and switch cells SC00, SC01, . . . , and to determine the conductive or nonconductive state of the corresponding switch cell according to the switching data of the memory cell chosen.

As described above, this embodiment is arranged with the transistor M3 interposed between the ferroelectric capacitor CF and the bit line BL. This makes it possible to connect an intended one CF of plural ferroelectric capacitors CF, CF, . . . , constituting the same column selectively to a bit line (for example the bit line BL0) through the corresponding transistor M3.

In other words, it is possible to read switching data selectively from an intended memory cell from among plural memory cells (for example the memory cells MC00, MC10, . . . ) through a bit line (for example the bit line BL0). Therefore, a row choosing function may be easily realized by the use of these transistors M3, M3, . . . , and to constitute a matrix section in a simple constitution.

Since the transistor M2 is interposed between the transistor M1 and the bit line BL, it is also possible to connect an intended transistor M1 of the plural transistors M1, M1, . . . , constituting the same column selectively to a bit line BL (for example the bit line BL0) through the corresponding transistor M2.

In other words, it is possible to give switching data selectively to an intended switch cell of plural switch cells (such as the switch cells SC00, SC10, . . . ) through a bit line (such as the bit line BL0). Therefore, a row choosing function is easily realized using the transistors M2, M2, . . . .

Moreover, like the switch circuit 21 shown in FIG. 1, even if the transistor M2 is set to a conductive state and immediately set back to a nonconductive state, the transistor M1 maintains either a conductive or nonconductive state for a certain period of time corresponding to the switching data given through the bit lines BL0, BL1, . . . .

Therefore, using the transistor M2 for realizing the row choosing function makes it possible to cause the transistor M1 to maintain a conductive or nonconductive state corresponding to the switching data for a certain period of time even without providing a separate circuit for temporarily storing the switching data.

For this reason, by arranging to perform reading actions to respective rows in succession and to complete the reading actions to all the rows within the above-mentioned specified period of time, it is possible to control substantially simultaneously the conductive or nonconductive state of all the switch cells corresponding to the switching data stored in the memory cells of all the rows according to the switching data.

In other words, a switch matrix circuit may be realized with a simple wiring arrangement that can control simultaneously the respective switch cells SC00, SC01, . . . . Namely, it is possible to realize a switch matrix circuit capable of reliably controlling switch cells with a simple constitution.

Since the plate lines PL0, PL1, . . . , are provided for the respective rows of the memory matrix MM, it is convenient when reading and writing the switching data by the row. Therefore, it is possible for example to realize a switch matrix circuit suitable for word parallel processing.

Incidentally, FIG. 5 shows an equivalent circuit as described above and the physical arrangement (actual positioning) of the elements is not limited to the one shown in FIG. 5. For example, the transistors M1 constituting the respective switch cells may be positioned in any way according to physical positioning of objects to be controlled for connection and disconnection using the transistors M1, and need not necessarily be arranged in well-organized order as shown in FIG. 5.

Figure 6:
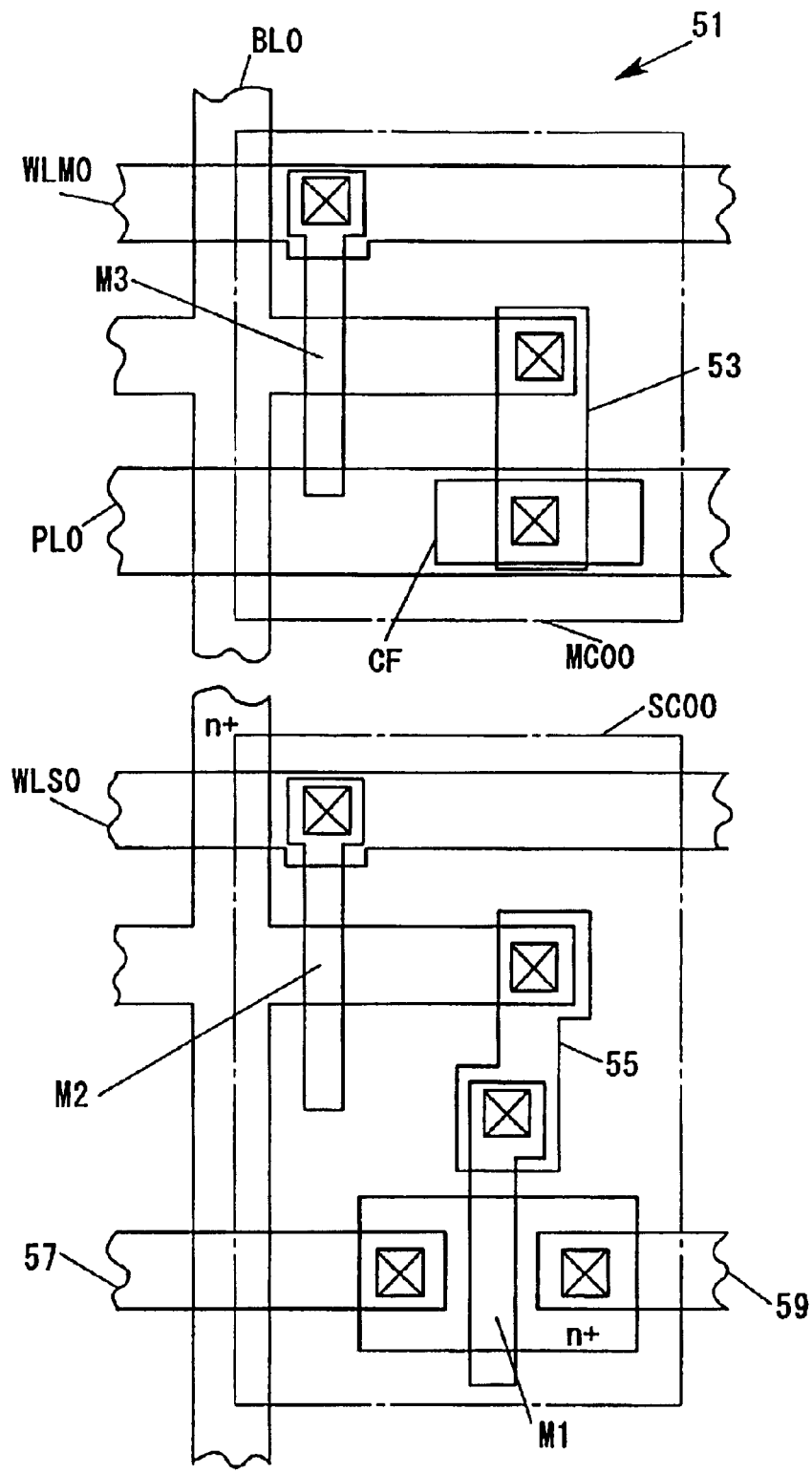
FIG. 6 shows an example of part of the switch matrix circuit 51, in actual constitution, shown in FIG. 5.

FIG. 6 shows an example of part of the switch matrix circuit 51, in actual dimensions, shown in FIG. 5. This embodiment, the switch matrix circuit 51, is arranged as a MOS (metal oxide semiconductor) type of semiconductor integrated circuit including ferroelectric capacitors.

This embodiment as shown in FIG. 6 is arranged with transistors M1, M2, and M3, and the ferroelectric capacitor CF formed on a p-type of semiconductor substrate. The source regions and drain regions of the transistors M1, M2, and M3 are made of silicon with high concentration of n-type of impurity diffused. The gates of the transistors M1, M2, and M3 are made of poly-silicon or metal silicide.

The ferroelectric layer of the ferroelectric capacitor CF is made of ferroelectric material such as PZT (lead zirconate titanate) or SBT (strontium bismuth tantalate). The second terminal 25 of the ferroelectric capacitor CF (FIG. 1) and the plate line PL0 are made of noble metal such as platinum, conductive oxide layer such as iridium oxide, or laminated layers of these materials. The first terminal 23 of the ferroelectric capacitor CF (FIG. 1) is made of noble metal such as platinum.

The bit line BL0 is made of silicon with high concentration of n-type of impurity diffused. The memory word line WLM0, switching word line WLS0, and internal lines 53, 55, 57, and 59 are made of aluminum. Incidentally, these wiring lines may also be made of other metals such as copper.

While the switch matrix circuit 51 in this embodiment is formed on a bulk board, it may also be formed for example on an SOI (silicon on insulator) board. Forming the switch matrix circuit 51 on the SOI board is advantageous because inter-element leak current is further reduced.

Figure 7:
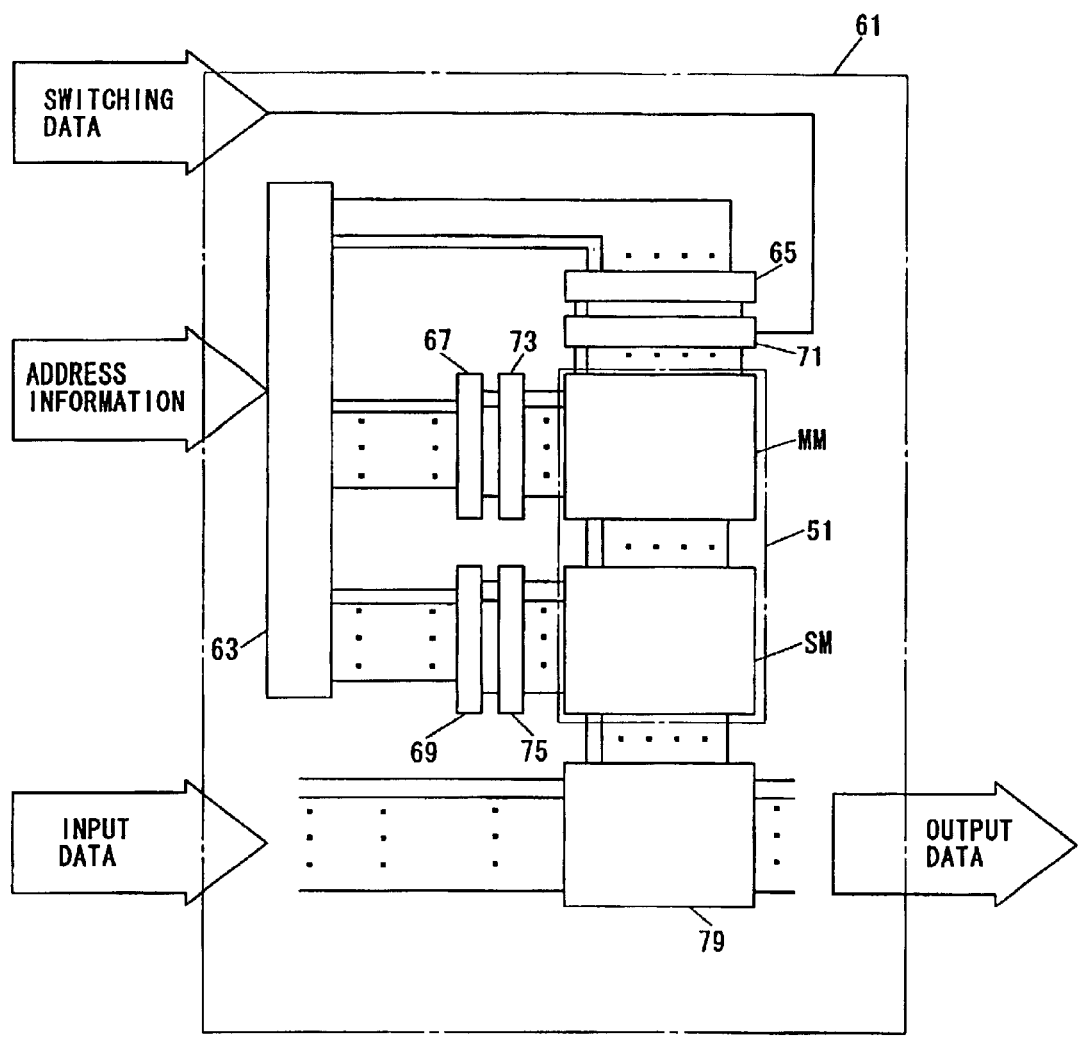
FIG. 7 shows a logical operation circuit 61 as still another embodiment of the present invention.

Next, FIG. 7 shows a logical operation circuit 61 as still another embodiment of the present invention. The logical operation circuit 61 is constituted with the switch matrix circuit 51 shown in FIG. 5 and realized for example as an FPGA. The logical operation circuit 61 comprises, besides the switch matrix circuit 51: address buffers 63, 65, 67, and 69; decoders 71, 73, and 75; and a logic constituting section 79.

The address buffer 63 temporarily holds address information inputted to specify a memory cell for the switching data to be written in, or address information inputted to specify a memory cell for the switching data to be read out, and a switch cell for controlling on and off actions (for conduction and non-conduction) according to the switching data read out.

The address buffer 65 temporarily holds part of the address information, stored in the address buffer 63, for specifying a column of the switch matrix circuit 51. The address buffers 67 and 69 temporarily hold respectively part of the address information, stored in the address buffer 63, for specifying a row of the memory matrix section MM and a row of the switch matrix section SM.

The decoder 71 activates, according to the address information held in the address buffer 65, a corresponding column out of the switch matrix circuit 51. The decoders 73 and 75 activate respectively corresponding rows out of the memory matrix section MM and the switch matrix section SM according to the address information held in the address buffers 67 and 69.

The logic constituting section 79 constitutes a logic according to the output result from the switch matrix circuit 51, namely the on or off state of the switch cells SC00, SC01, . . . , constituting the switch matrix section SM, and applies a logical operation to the input data according to the logic constitution to obtain output data.

Figure 8:
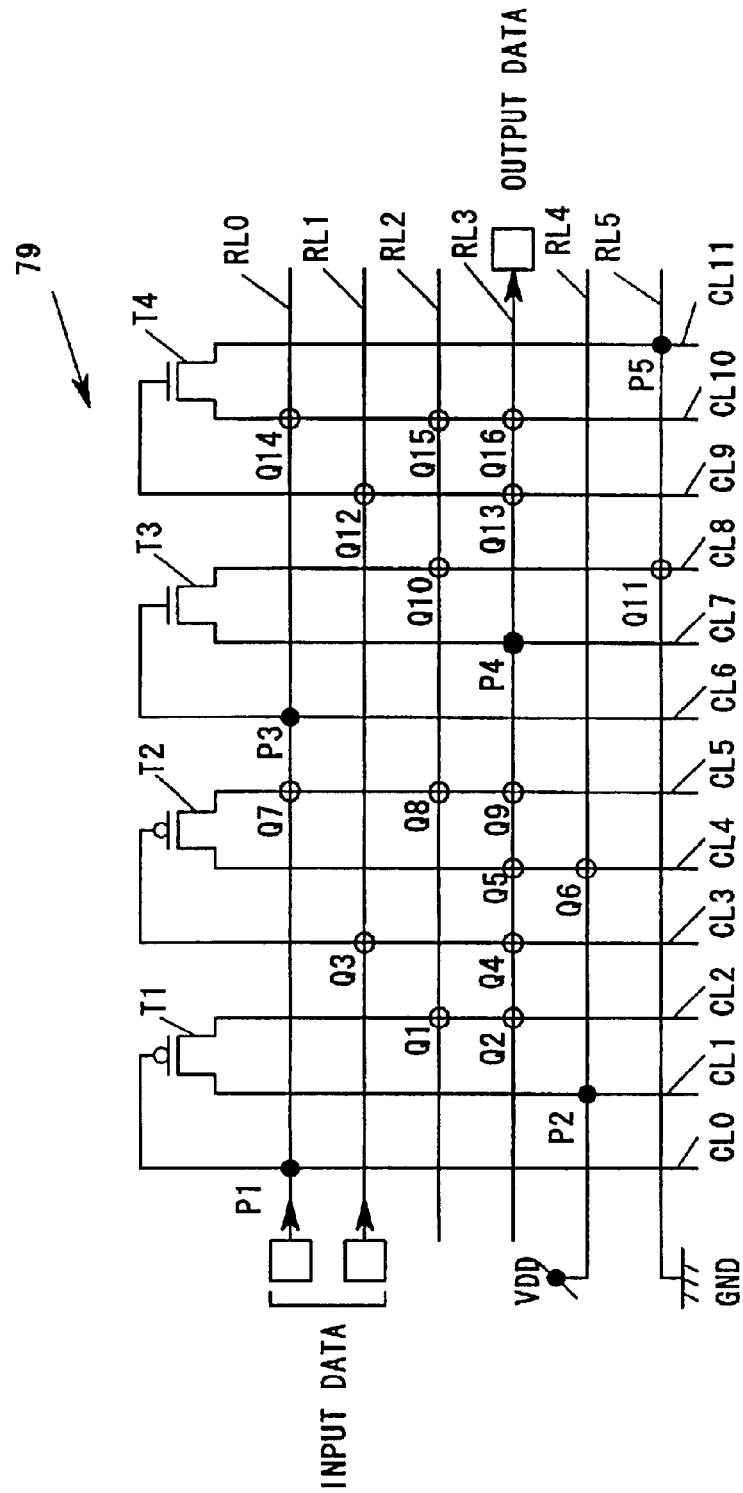
FIG. 8 is an example circuit diagram of a logic constituting section 79.

FIG. 8 is an example circuit diagram of a logic constituting section 79. In this example, the logic constituting section 79 comprises six row lines RL0 to RL5, 12 column lines CL0 to CL11, and four logic constituting elements or transistors T1 to T4.

The row lines RL0 and RL1 are input data lines. The row line RL3 is an output line. The row lines RL4 and RL5 are lines for supplying respectively a power supply potential VDD and a ground potential GND, constituting a pair of power supply lines. The transistors T1 and T2 are both p-channel MOSFETs and the transistors T3 and T4 are both n-channel MOSFETs.

Of the intersections where the row lines RL0 to RL5 cross the column lines CL0 to CL11 shown in FIG. 8, the five intersections P1 to P5 indicated with black circles are connected in advance. The 16 intersections Q1 to Q16 indicated with white circles are respectively provided with switch cells SC00, SC01, . . . , shown in FIG. 5.

That is to say, the intersections Q1 to Q16 may be set to either connected or disconnected state through the terminals 31 and 33 of each of the transistors M1, M1, . . . , constituting the switch cells SC00, SC01, . . . , shown in FIG. 5. In this way the logic is constituted.

Figure 9:
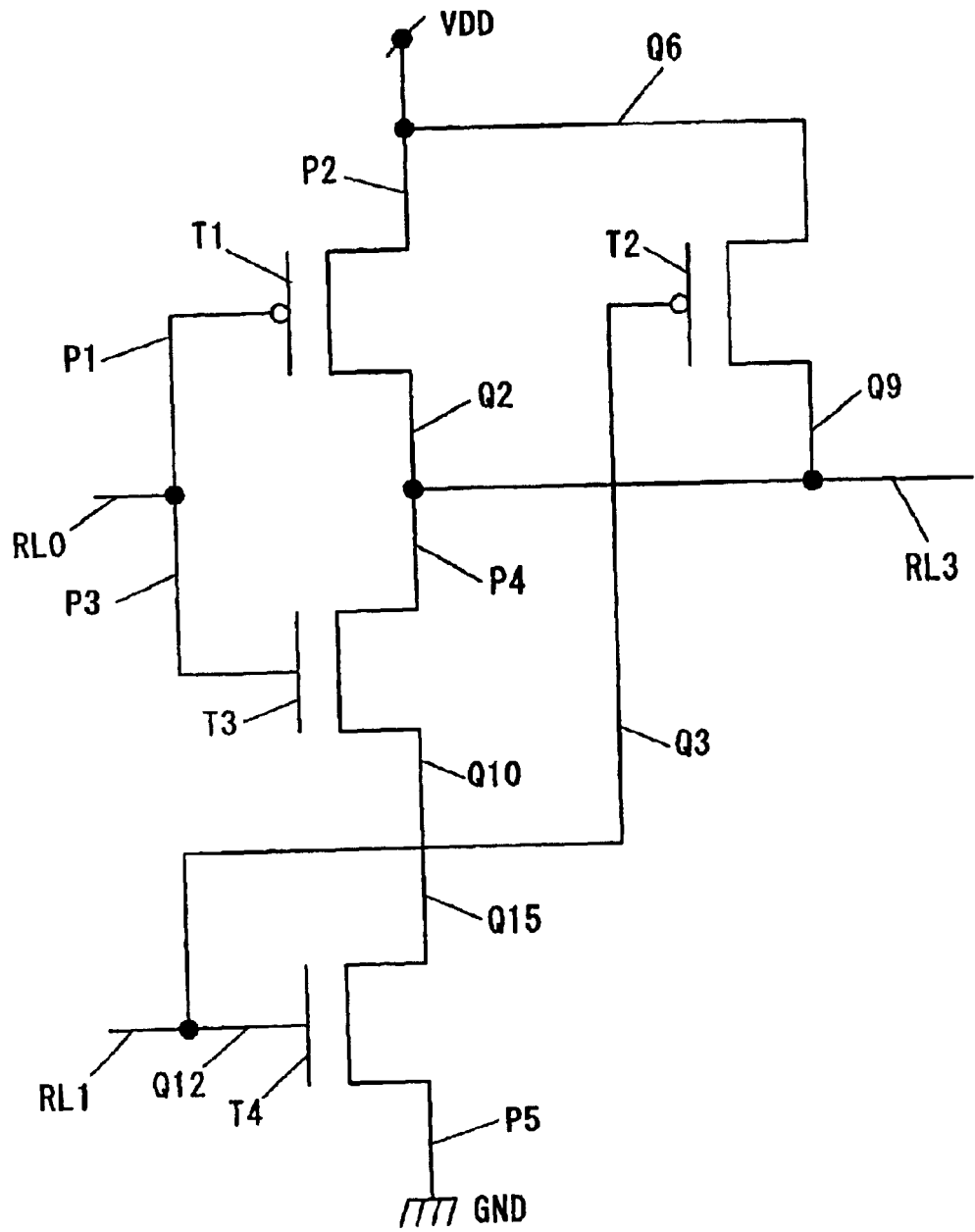
FIG. 9 shows an example of logic circuit constituted in the logic constituting section 79.
Figure 10A:
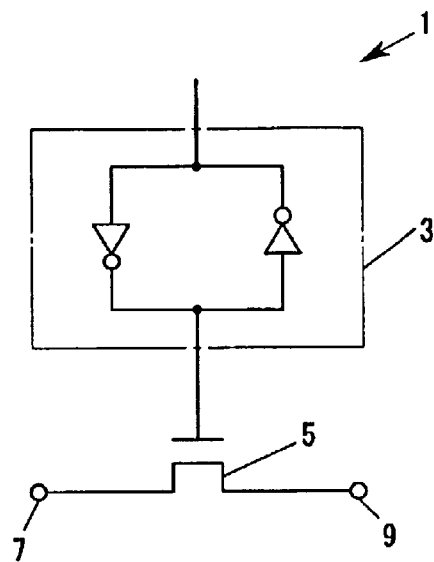
FIGS. 10A and 10B show switch circuits used in a conventional FPGA.
Figure 10B:
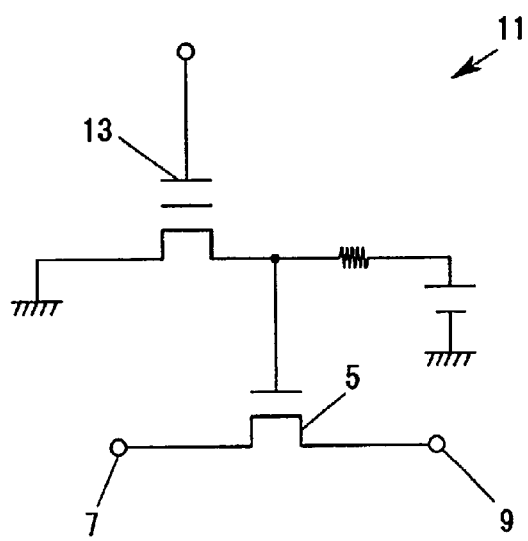

FIG. 9 shows an example of logic circuit constituted in the logic constituting section 79. The logic constitution shown in FIG. 9 is the one in which, of the 16 intersections Q1 to Q16 shown in FIG. 8, the intersections Q2, Q3, Q6, Q9, Q10, Q12, and Q15 are connected, and others disconnected, to form a two-input NAND (negative of logical multiplication) circuit.

Although not shown, for example a two-input NOR (negative of logical sum) circuit, an inverter circuit, and a cross-coupled flip-flop circuit may be constituted likewise. In other words, according to this embodiment, it is possible to realize a logical operation circuit of a simple constitution that can be changed in logical constitution, and capable of reliably performing logical operations according to its logical constitution.

Incidentally, while the ferroelectric capacitor is employed in the above embodiments as the memory element for constituting the memory cell, the memory element is not limited to that. For example, ferroelectric memory elements made of a ferroelectric material such as a ferroelectric transistor may also be used. The memory element may also be of other type than ferroelectric such as a nonvolatile memory element or a volatile memory element.

Although the above embodiments are described as examples in which the n-channel MOSFETs are used as the switch field effect transistors, switching elements, memory choosing elements, and switch choosing elements, the present invention is not limited to the above description. For example, p-channel MOSFETs and other FETs (field effect transistors) may also be used as the switch field effect transistors, switching elements, memory choosing elements, and switch choosing elements. Also, transistors other than the FETs or elements other than the transistors may also be used as the switching elements, memory choosing elements, and switch choosing elements.

Although the above embodiments are described as examples in which the plate lines are the row choosing plate lines, the present invention is not limited to that description. For example, the plate lines may be column choosing plate lines provided to correspond to respective columns of the memory matrix section. It is also possible to use a single plate line connected to every ferroelectric capacitor of the memory matrix section.

While the above embodiments are described as examples in which the memory matrix section and the switch matrix section respectively comprise memory cells and switch cells arranged in rows and columns, the present invention is not limited to the above description. For example, the present invention may also be applied to the case in which both of the memory matrix section and the switch matrix section respectively comprise memory cells and switch cells arranged in a single column and plural rows. In that case, the column choosing line is single.

The switch matrix circuit according to the present invention comprises a memory matrix section comprising plural memory cells arranged in rows and columns for storing switching data using memory elements, a switch matrix section comprising plural switch cells arranged in rows and columns corresponding to the memory cells to take either conductive or nonconductive state, one or more column choosing lines provided to correspond to respective columns of the memory matrix section and the switch matrix section to choose memory cells and switch cells that belong to the same single column of the memory matrix section and the switch matrix section, plural memory row choosing lines provided corresponding to the respective rows of the memory matrix to choose memory cells that belong to the same single row of the memory matrix section, and plural switch row choosing lines provided corresponding to the respective rows of the switch matrix section to choose switch cells that belong to the same single row of the switch matrix section. This switch matrix circuit is also arranged to choose an intended memory cell and a corresponding switch cell out of plural memory cells and switch cells using column choosing lines, memory row choosing lines, and switch row choosing lines, and to determine either conductive or nonconductive state of the corresponding switch cell according to the switching data of the memory cell chosen. The switch cell comprises: a switch choosing element having a control terminal connected to the switch row choosing line, a first input-output terminal connected to the column choosing line, and a second input-output line to be conductive or nonconductive to the first input-output terminal according to the control signal inputted to the control terminal; and a switch field effect transistor having a gate terminal connected to the second input-output terminal of the switch choosing element and first and second switch terminals to be mutually conductive or nonconductive according to the control signal inputted to the gate terminal.

Therefore, interposing the switch choosing element between the switch field effect transistor and the column choosing line makes it possible to connect an intended one of plural switch field effect transistors constituting the same single column selectively to the column choosing line through a corresponding switching element.

In other words, it is possible to give switching data selectively to an intended one of plural switch cells through a single column choosing line. Therefore, row choosing function may be easily realized using those switch choosing elements.

Here, since the gate terminal of the switch field effect transistor is connected only to the second input-output terminal of the switch choosing element, if the switch choosing element is set to nonconductive state, the moving path of the charge accumulated at the gate terminal of the switch field effect transistor is shut off.

Therefore, even after the switch choosing element is set to a nonconductive state, the switch field effect transistor maintains the state of the time when the switch choosing element was in the conductive state for a period of time during which the charge accumulated at the gate terminal leaks and decreases to some extent.

Therefore, even if the switch choosing element is set to a conductive state and immediately set back to a nonconductive state, the switch field effect transistor maintains for a certain period of time either conductive or nonconductive state corresponding to the switching data given through the column choosing line.

That is to say, using the switch choosing element for realizing the row choosing function makes it possible to cause the switch field effect transistor to maintain either conductive or nonconductive state corresponding to the switching data for a specified period of time without employing a special circuit for temporarily storing the switching data.

For this reason, by arranging to perform reading actions to respective rows in succession and to complete the reading actions to all the rows within the above-mentioned specified period of time, it is possible to control substantially simultaneously the conductive or nonconductive state of all the switch cells corresponding to the switching data stored in the memory cells of all the rows according to the switching data.

In other words, a switch matrix circuit may be realized with a simple wiring arrangement that can control simultaneously the respective switch cells. Namely, it is possible to realize a switch matrix circuit capable of reliably controlling switch cells with a simple constitution.

In this switch matrix circuit according to the present invention, the memory element is a ferroelectric capacitor having the first and second terminals. The memory cell further comprises a memory choosing element having a control terminal connected to the memory row choosing line, a first input-output terminal connected to the column choosing line, a second input-output terminal to be either conductive or nonconductive to the first input-output terminal according to the control signal inputted to the control terminal and to be connected to the first terminal of the ferroelectric capacitor. This switch matrix circuit further comprises: a plate line connected to the second terminal of the ferroelectric capacitor so as to apply a specified potential to the second terminal of the ferroelectric capacitor at the time of writing and reading switching data to and from the ferroelectric capacitor, and a rated potential generating circuit connected to the column choosing line so as to generate the rated potential corresponding to the switching data at the time of reading the switching data from the ferroelectric capacitor.

Consequently, since the switching data are stored using the ferroelectric capacitor, the switching data are held even power supply is shut off. It is also possible to rewrite the switching data using the same action voltage as that for reading the switching data. As a result, the switching data may be rewritten without using a special programming device. It is also possible to rewrite the switching data almost at the same speed as that for reading the switching data. Therefore, the switching data may be rewritten at a high speed. Furthermore, the rewritable number of times of the switching data becomes about $10^{15}$ times by using the ferroelectric capacitor, and is quite more than that of the conventional floating gate type of transistor.

Using the ferroelectric capacitor, the plate line, and the rated potential generating circuit as described above makes it possible to realize a ferroelectric memory element of the so-called destructive read type with high data re-productiveness in a simple constitution. Therefore, it is possible to realize a switch matrix circuit that is simple in constitution and high in reliability.

Interposing a memory choosing element between the ferroelectric capacitor and the column choosing line makes it possible to connect intended one of plural ferroelectric capacitors constituting the same single column selectively to the column choosing line through the corresponding memory choosing element.

In other words, it is possible to read the switching data selectively from intended one of plural memory cells through a single column choosing line. Therefore, row choosing function may be realized easily using those memory choosing elements. Consequently, the memory matrix section may be arranged in a simple constitution.

In this switch matrix circuit according to the present invention, the plate lines are row choosing plate lines provided corresponding to respective rows of the memory matrix section for connecting only to the second terminal of the ferroelectric capacitors constituting the memory cells belonging to the same single row of the memory matrix section.

Therefore, it is convenient when reading and writing the switching data by the row. Therefore, it is possible for example to realize a switch matrix circuit suitable for word parallel processing.

The logical operation circuit according to the present invention is the one that constitutes a logic using any of the above-described switch matrix circuits, and applies a logical operation to input data according to the logical constitution to obtain output data. This logical operation circuit comprises an input data line for inputting data, an output data line for outputting data, a pair of power supply lines, and plural logic constituting elements. The logic constituting element has a control terminal and first and second input-output terminals to be mutually conductive or nonconductive according to a control signal inputted to the control terminal. This logical operation circuit constitutes logics by making mutually conductive or nonconductive the input data line, the output data line, the paired power supply lines, and the control terminal and first and second input-output terminals of the plural logic constituting elements through the first and second switch terminals of the switch field effect transistor of the switch matrix circuit.

Therefore, a logical operation circuit may be realized that is simple in constitution, capable of changing logical constitution and performing reliable logical operations according to the logical constitution.

The switch circuit according to the present invention comprises memory cells for storing switching data using memory elements, switch cells that take either conductive or non conductive state, connection lines for interconnecting the memory cells and the switch cells, and switch connection control lines for carrying a switch connection control signal of whether or not the memory cells and the switch cells are to be interconnected through the connection lines, and arranged to determine the conductive or nonconductive state of the switch cells according to the switching data of the memory cell. The switch cell has a switch choosing element and a switch field effect transistor. The switch choosing element has a control terminal connected to the switch connection control line, a first input-output terminal connected to the connection line, and a second input-output terminal to be conductive or nonconductive to the first input-output terminal according to the control signal inputted to the control terminal. The switch field effect transistor has a gate terminal connected to the second input-output terminal of the switch choosing element, and first and second switch terminals to be mutually conductive or non conductive according to the control signal inputted to the gate terminal.

Since the gate terminal of the switch field effect transistor is connected only to the second input-output terminal of the switch choosing element, if the switch choosing element is set to a nonconductive state, the moving path for the charge accumulated at the gate terminal of the switch field effect transistor is shut off.

Therefore, even after the switch choosing element is set to a nonconductive state, the switch field effect transistor maintains the state of the time when the switch choosing element was in a conductive state for a period of time during which the charge accumulated at the gate terminal of the switch field effect transistor leaks and decreases to a certain extent.

Therefore, even if the switch choosing element is set to a conductive state and immediately set back to a nonconductive state, the switch field effect transistor remains in the conductive or nonconductive state corresponding to the switching data given through the connection line for a certain period of time.

In other words, it is possible to cause the switch field effect transistor to remain in conductive or nonconductive state for a specified period of time using a switch choosing element of a simple constitution without using a special circuit for temporarily storing the switching data.

Therefore, even if for example the connection line is used for any other after reading the switching data and determining the conductive or nonconductive state of the switch cell, the switch cell maintains the state corresponding to the switching data. That is to say, a switch circuit may be realized that is capable of reliably controlling the switch cell, simple in constitution, and high in general nature.

In the switch circuit according to the present invention, the memory element is a ferroelectric capacitor having a first terminal connected to the connection line, and a second terminal. The switch circuit further has a plate line connected to the second terminal of the ferroelectric capacitor so as to apply a specified potential to the second terminal of the ferroelectric capacitor at the time of writing and reading the switching data to and from the ferroelectric capacitor, and a rated potential generating circuit for generating a rated potential corresponding to the switching data at the time of reading the switching data from the ferroelectric capacitor.

Since the switching data are stored using the ferroelectric capacitor, the switching data are held even if the power supply is shut off. It is also possible to rewrite the switching data using the same action voltage as the action voltage for reading the switching data. Therefore, the switching data may be rewritten without using a special programming device. It is also possible to rewrite the switching data almost at the same speed as that for reading the switching data. Therefore, the switching data may be rewritten at a high speed.

Using the ferroelectric capacitor, the plate line, and the rated potential generating circuit as described above makes it possible to realize a ferroelectric memory element of the so-called destructive read type with high data re-productiveness and a simple constitution. Therefore, it is possible to realize a switch circuit that is simple in constitution and high in reliability.

The switch circuit of the present invention comprises a memory cell for storing switching data using a memory element, a switch cell that takes either conductive or nonconductive state, and a connection line for interconnecting the memory cell and the switch cell, and is arranged to determine either the conductive or nonconductive state of the switch cell according to the switching data of the memory cell. The memory cell is a ferroelectric capacitor having a first terminal connected to the connection line, and a second terminal. The switch circuit further comprises a plate line connected to the second terminal of the ferroelectric capacitor so as to apply a specified potential to the second terminal of the ferroelectric capacitor at the time of writing and reading actions for the switching data to and from the ferroelectric capacitor, and a rated potential generating circuit for generating the rated potential corresponding to the switching data at the time of reading action for the switching data from the ferroelectric capacitor. The switch cell comprises a switching element having a control terminal connected to the connection line and a first and a second switch terminal to be mutually conductive or nonconductive according to the control signals inputted to the control terminal.

Since the switching data are stored using the ferroelectric capacitor, the switching data are held even after the power supply is shut off. It is also possible to rewrite the switching data using the same action voltage as the action voltage for reading the switching data. Therefore, the switching data may be rewritten without using a special programming device. It is also possible to rewrite the switching data almost at the same speed as that for reading the switching data. Therefore, the switching data may be rewritten at a high speed.

Using the ferroelectric capacitor, the plate line, and the rated potential generating circuit as described above makes it possible to realize a ferroelectric memory element of the so-called destructive read type with high data re-productiveness in a simple constitution. Therefore, it is possible to realize a switch circuit that is simple in constitution and high in reliability.

While the present invention is described above by way of preferable embodiments, the wording in the description is not meant to be restrictive but to be illustrative. Therefore, various modifications may be made within the scope and spirit of the appended claims.

What is claimed is:

1. A switch matrix circuit comprising:
a memory matrix section arranged plural memory cells in rows and columns for storing switching data using a memory element;
a switch matrix section arranged plural switch cells that take either conductive or nonconductive state in rows and columns corresponding to said memory cells;
one or more column choosing lines provided corresponding to the respective columns of said memory matrix section and switch matrix section so as to choose memory cells and switch cells that belong to the same column of said memory matrix section and switch matrix section;
plural memory row choosing lines provided corresponding to the respective rows of said memory matrix section so as to choose the memory cells belonging to the same row of said memory matrix section; and
plural switch row choosing lines provided corresponding to the respective rows of said switch matrix so as to choose the switch cells that belong to the same row of said switch matrix section; and
arranged to choose intended one of said plural memory cells and a corresponding switch cell by means of said column choosing line, memory row choosing line, and switch row choosing line, and to determine either conductive or non conductive state of the corresponding switch cell according to the switching data of the memory cell chosen,
wherein said switch cell comprises:
a switch choosing element having a control terminal connected to said switch row choosing line, a first input-output terminal connected to said column choosing line, and a second input-output terminal to be conductive or non conductive to said first input-output terminal according to a control signal inputted to said control terminal, and
a switch field effect transistor having a gate terminal connected the second input-output terminal of said switch choosing element, and first and second switch terminal to be mutually conductive or nonconductive according to a control signal inputted to said gate terminal;
wherein said memory element; is a ferroelectric capacitor having first and second terminals;
said memory cell further comprising a memory choosing element having a control terminal connected to said memory row choosing line, a first input-output terminal connected to said column choosing line, and a second input-output terminal that becomes either conductive or nonconductive to said first input-output terminal according to a control signal inputted to said control terminal and that is connected to the first terminal of said ferroelectric capacitor;
further comprising:
a plate line connected to the second terminal of said ferroelectric capacitor so as to apply a specified potential to the second terminal of said ferroelectric capacitor at the time of writing and reading said switching data to and from said ferroelectric capacitor; and
a rated potential generating circuit connected to said column choosing line so as to generate the rated potential corresponding to said switching data at the time of reading said switching data from said ferroelectric capacitor.

2. A switch matrix circuit according to claim 1, wherein said plate lines are plural row choosing plate lines provided corresponding to respective rows of said memory matrix section so as to be connected only to the second terminals of ferroelectric capacitors constituting the memory cells belonging to the same row of said memory matrix section.

3. A switch matrix circuit according to claim 1, wherein said rated potential generating circuit is a sense amplifier.

4. A switch matrix circuit according r to claim 1, wherein said switch choosing element and memory choosing element are field effect transistors.

5. A logical operation circuit that constitutes a logic using a switch matrix circuit and applies logical operation to input data according to said constituted logic to obtain output data, comprising:
an input data line for inputting said input data;
an output data line for outputting said output data;
a pair of power supply lines; and
plural logic constituting elements having a control terminal, and first and second input-output terminals that become mutually conductive or nonconductive according to a control signal inputted to said control terminal;
said switch matrix circuit comprising:
a memory matrix section arranged plural memory cells in rows and columns, for storing switching data using a memory element;
a switch matrix section arranged plural switch coils in rows and columns corresponding to said memory cells that take either conductive or nonconductive states;

one or more column choosing lines provided corresponding to respective columns of said memory matrix section and switch matrix section so as to choose memory cells and switch cells that belong to the same column of said memory matrix section and switch matrix section;

plural memory row choosing lines provided corresponding to respective rows of said memory matrix so as to choose memory cells that belong to the same row of said memory matrix section; and plural switch row choosing lines provided corresponding to respective rows of said switch matrix section so as to choose switch cells that belong to the same row of said switch matrix section; and arranged to choose intended one of said plural memory cell; and a corresponding one of said plural switch cells by means of said column choosing line, memory row choosing line, and switch row choosing line, and to determine either conductive or nonconductive state of said corresponding switch cell according to the switching data of said memory cell chosen;

said switch cell comprising:

a switch choosing element having a control terminal connected said switch row choosing line, a first input-output terminal connected to said column choosing line, and a second input-output terminal that becomes conductive or nonconductive to said first input-output terminal according to a control signal inputted said control terminal; and a switch geld effect transistor having a gate terminal connected to the second input-output terminal of said switch choosing element, and first and second switch terminals that become mutually conductive or nonconductive according to a control signal inputted to said gate terminal; and wherein said logic is constituted by mutually connecting and disconnecting said input data line, output data line, paired power supply lines, and the control terminal, first and second input-Output terminals of said plural logic constituting elements through the first and second switch terminals of the switch field effect transistor of said switch matrix circuit;

wherein said memory element is a ferroelectric capacitor having first an second terminals, memory cell further comprising a memory choosing element having a control terminal connected to said memory row choosing line, a first input-output terminal connected to said column choosing line, and a second input-output terminal that becomes conductive or nonconductive to said first input-output terminal according to a control signal inputted to said control terminal and that is connected to the first terminal of said ferroelectric capacitor, further comprising:

a plate line connected to the second terminal of said ferroelectric capacitor so as to apply a specified potential to the second terminal of said ferroelectric capacitor at the time of writing and reading said switching data to and from said ferroelectric capacitor, and a rated potential generating circuit connected to said column choosing lime for generating a rated potential corresponding to said switching data at the time of reading said switching data from said ferroelectric capacitor.

6. A logical operation circuit according to claim 5, wherein said plate lines are plural row choosing plate lines provided to corresponding to respective rows of said memory matrix said ferroelectric capacitors constituting the memory cells belonging to the same row of said memory matrix section.

7. A logical operation circuit according to claim 5, wherein said rated potential generating circuit is a sense amplifier.

8. A logical operation circuit according to claim 5, wherein said switch choosing element and memory choosing element are field effect transistors.

9. A switch circuit comprising:

a memory cell for storing switching data using a memory element;

a switch cell that takes either conductive or nonconductive state;

a connection line for connecting said memory and said switch cell; and a switch connection control line for carrying a switch connection control signal of whether or not said memory and said switch cell are to be connected through the connection line;

and arranged that the conductive or nonconductive state of said switch cell is determined according to the switching data of said memory cell;

said switch cell comprising:

a switch choosing element having a control terminal connected to said switch connection control line, a first input-output terminal connected to said connection line, and a second input-output terminal that becomes conductive or nonconductive to said first input-output terminal according to a control signal inputted to said control terminal; and a switch field effect transistor having a gate terminal connected to the second input-output terminal of said switch choosing element, and first and second switch terminals that become mutually conductive or nonconductive according to a control signal inputted to said gate terminal;

wherein said memory element is a ferroelectric capacitor having a first terminal connected to said connection line, and a second terminal, further comprising:

a plate line connected to the second terminal of said ferroelectric capacitor so as to apply a specified potential to the second terminal of said ferroelectric capacitor at the time of writing and reading said switching data to and from said ferroelectric capacitor; and a plated potential generating circuit connected to said connection line for generating the rated potential corresponding to said switching data at the time of reading said switching data from said ferroelectric capacitor.

10. A switch circuit according to claim 9, wherein said rated potential generating circuit is a sense amplifier.

11. A switch circuit according to claim 9, further comprising a memory connection control line for carrying a memory connection control signal of whether or not said memory cell and said connection line are to be connected, and said memory cell comprising a ,memory choosing element having a control terminal connected to said memory connection control line, a first input-output terminal connected to said connection line, and a second input-output terminal connected to the first terminal of said ferroelectric capacitor so as to become conductive or nonconductive to said first input-output terminal according to a control signal inputted to said control terminal.

12. A switch circuit according to claim 11, wherein said switch choosing element and memory choosing element are field effect transistors.

13. A switch circuit comprising:

a memory cell for storing switching data using a memory element;

a switch cell that takes either conductive or nonconductive state; and a connection line for interconnecting said memory cell and said switch cell;

and arranged to determine the conductive or nonconductive state of said switch cell according to switching data of said memory;

said memory cell being a ferroelectric capacitor having a first terminal connected to said connection line, and a second terminal, further comprising:

a plate line connected to the second terminal of said ferroelectric capacitor so as to apply a specified potential to the second terminal of said ferroelectric capacitor at the time of writing and reading the switching data to and from said ferroelectric capacitor; and a rated potential generating circuit connected to said connection line for generating a rated potential corresponding to said switching data at the time of reading said switching data from said ferroelectric capacitor;

and said switch cell comprising a switching element having a control terminal connected to said connection line, and first and second switch terminals that become mutually conductive or nonconductive according to a control signal inputted to said control terminal.

14. A switch circuit according to claim 13, wherein said rated potential circuit is a sense amplifier.

15. A switch circuit according to claim 13, further comprising:

a memory connection control line for carrying a memory connection control signal of whether or not said memory cell and said connection line are to be interconnected, and said memory cell comprising:

a memory choosing element having a control terminal connect to said memory connection line, a first input-output terminal connected to said connection line, a second input-output terminal that becomes conductive or nonconductive to said first input-output terminal according to a control signal inputted to said control terminal and that is, connected to the first terminal of said ferroelectric capacitor.

16. A switch circuit according to claim 15, wherein said switching element and said memory choosing element are field effect transistors.

* * * * *